United States Patent
Nomoto et al.

(10) Patent No.: US 8,853,017 B2
(45) Date of Patent: Oct. 7, 2014

(54) ORGANIC THIN FILM TRANSISTOR, PRODUCTION METHOD THEREOF, AND ELECTRONIC DEVICE

(75) Inventors: Kazumasa Nomoto, Kanagawa (JP); Nobuhide Yoneya, Kanagawa (JP); Takahiro Ohe, Tokyo (JP)

(73) Assignee: Sony Corporation, Tokyo (JP)

( * ) Notice: Subject to any disclaimer, the term of this patent is extended or adjusted under 35 U.S.C. 154(b) by 91 days.

(21) Appl. No.: 12/510,408

(22) Filed: Jul. 28, 2009

(65) Prior Publication Data
US 2010/0032660 A1 Feb. 11, 2010

(30) Foreign Application Priority Data

Aug. 7, 2008 (JP) ................................ 2008-203881

(51) Int. Cl.
*H01L 21/84* (2006.01)
*H01L 51/10* (2006.01)
*H01L 51/00* (2006.01)
*H01L 51/05* (2006.01)

(52) U.S. Cl.
CPC ......... *H01L 51/0021* (2013.01); *H01L 51/0541* (2013.01); *H01L 51/105* (2013.01); *H01L 51/052* (2013.01); *H01L 51/0545* (2013.01)
USPC ................ 438/161; 438/151; 257/E51.007; 257/E51.027

(58) Field of Classification Search
CPC ............ H01L 51/0021; H01L 51/0023; H01L 51/0545; H01L 51/052; H01L 51/105
USPC ................ 257/40, 353, E51.005, E51.007, 257/E21.174, E29.151, E51.027; 438/40, 438/99, 151, 158, 161
See application file for complete search history.

(56) References Cited

U.S. PATENT DOCUMENTS

| | | | | |
|---|---|---|---|---|
| 5,079,600 A | * | 1/1992 | Schnur et al. | 257/750 |
| 5,703,173 A | * | 12/1997 | Koloski et al. | 525/326.2 |
| 5,854,139 A | * | 12/1998 | Aratani et al. | 438/780 |
| 6,136,702 A | * | 10/2000 | Chandross et al. | 438/678 |
| 6,333,598 B1 | * | 12/2001 | Hsu et al. | 313/495 |

(Continued)

FOREIGN PATENT DOCUMENTS

| | | |
|---|---|---|
| JP | 2000-357671 A | 12/2000 |
| JP | 2001-203364 | 7/2001 |

(Continued)

OTHER PUBLICATIONS

Japanese Patent Office, Office Action issued in Patent Application JP 2008-203881, on Oct. 26, 2010.

*Primary Examiner* — William F Kraig
*Assistant Examiner* — Joseph C Nicely
(74) *Attorney, Agent, or Firm* — Dentons US LLP

(57) ABSTRACT

An organic thin film transistor is disclosed, including a substrate formed of an organic insulating layer, a first layer deposited on the substrate using a plating technique to be used for forming a source electrode and a drain electrode, a second layer of a metal material deposited covering the first layer using a further plating technique to be used for forming the source electrode and the drain electrode with the metal material capable of forming an ohmic contact with an organic semiconductor material lower than the first layer, and an organic semiconductor layer over a region between the source electrode and the drain electrode, which are each formed with the first layer and the second layer. Also disclosed is an electric device provided with the organic thin film transistor.

7 Claims, 7 Drawing Sheets

(56) References Cited

U.S. PATENT DOCUMENTS

| | | | |
|---|---|---|---|
| 6,335,539 B1* | 1/2002 | Dimitrakopoulos et al. | 257/40 |
| 6,534,788 B1* | 3/2003 | Yeo et al. | 257/72 |
| 6,806,124 B2* | 10/2004 | Klauk et al. | 438/149 |
| 6,869,638 B2* | 3/2005 | Baum et al. | 427/126.1 |
| 6,991,675 B2* | 1/2006 | Suda et al. | 106/1.23 |
| 6,992,324 B2* | 1/2006 | Nagayama | 257/40 |
| 7,038,237 B2* | 5/2006 | Nagayama | 257/40 |
| 7,208,756 B2* | 4/2007 | Shih et al. | 257/40 |
| 7,342,245 B2* | 3/2008 | Tanabe | 257/40 |
| 7,384,814 B2* | 6/2008 | Huitema et al. | 438/99 |
| 7,683,366 B2* | 3/2010 | Yang | 257/40 |
| 7,872,254 B2* | 1/2011 | Suwa et al. | 257/40 |
| 7,923,718 B2* | 4/2011 | Wu et al. | 257/40 |
| 7,956,354 B2* | 6/2011 | Suh et al. | 257/40 |
| 8,076,733 B2* | 12/2011 | Lee et al. | 257/401 |
| 8,193,527 B2* | 6/2012 | Yang | 257/40 |
| 8,258,504 B2* | 9/2012 | Benwadih | 257/40 |
| 8,486,304 B2* | 7/2013 | Wu et al. | 252/500 |
| 8,497,494 B2* | 7/2013 | Kim | 257/40 |
| 2004/0012017 A1* | 1/2004 | Nagayama | 257/40 |
| 2004/0161873 A1* | 8/2004 | Dimitrakopoulos et al. | 438/99 |
| 2005/0057136 A1* | 3/2005 | Moriya et al. | 313/311 |
| 2005/0090044 A1* | 4/2005 | Kayaba et al. | 438/127 |
| 2005/0250262 A1* | 11/2005 | Suzuki et al. | 438/151 |
| 2005/0279996 A1* | 12/2005 | Takubo et al. | 257/40 |
| 2006/0027860 A1* | 2/2006 | Nomoto | 257/327 |
| 2006/0054883 A1* | 3/2006 | Hanna et al. | 257/40 |
| 2006/0108581 A1* | 5/2006 | Ahn et al. | 257/40 |
| 2006/0197084 A1* | 9/2006 | Tanabe | 257/57 |
| 2006/0273303 A1* | 12/2006 | Wu et al. | 257/40 |
| 2006/0278579 A1* | 12/2006 | Choi et al. | 210/634 |
| 2006/0278580 A1* | 12/2006 | Striemer et al. | 210/650 |
| 2007/0090352 A1* | 4/2007 | Ahn et al. | 257/40 |
| 2007/0158644 A1* | 7/2007 | Chabinyc et al. | 257/40 |
| 2007/0296047 A1* | 12/2007 | Kretz et al. | 257/410 |
| 2008/0036698 A1* | 2/2008 | Kawasaki et al. | 345/55 |
| 2008/0131986 A1* | 6/2008 | Lee et al. | 438/29 |
| 2008/0237580 A1* | 10/2008 | Okuyama et al. | 257/40 |
| 2010/0021748 A1* | 1/2010 | Hu et al. | 428/458 |
| 2010/0055699 A1* | 3/2010 | Kahya | 435/6 |
| 2010/0055854 A1* | 3/2010 | Kobayashi et al. | 438/197 |
| 2010/0065829 A1* | 3/2010 | Forrest et al. | 257/40 |
| 2010/0090220 A1* | 4/2010 | Kawasaki et al. | 257/57 |
| 2010/0129535 A1* | 5/2010 | Shah et al. | 427/126.1 |
| 2010/0181558 A1* | 7/2010 | Yamashita et al. | 257/40 |
| 2010/0203687 A1* | 8/2010 | Cho et al. | 438/151 |
| 2010/0244000 A1* | 9/2010 | Tanaka et al. | 257/40 |
| 2010/0252176 A1* | 10/2010 | Tokie et al. | 156/150 |
| 2010/0314611 A1* | 12/2010 | Murata et al. | 257/40 |
| 2011/0014736 A1* | 1/2011 | Kim et al. | 438/34 |
| 2011/0101302 A1* | 5/2011 | Zhou et al. | 257/13 |
| 2011/0152107 A1* | 6/2011 | McGrath et al. | 506/7 |
| 2011/0303911 A1* | 12/2011 | Fujii et al. | 257/40 |
| 2012/0083069 A1* | 4/2012 | Kim et al. | 438/99 |

FOREIGN PATENT DOCUMENTS

| | | | |
|---|---|---|---|
| JP | 2003229579 A * | 8/2003 | H01L 29/786 |
| JP | 2007-059893 | 3/2007 | |
| JP | 2007-305839 | 11/2007 | |

* cited by examiner

Tr1: SWITCHING TRANSISTOR
(1a, 1b, 1c ORGANIC THIN FILM TRANSISTOR)
Tr2: DRIVING TRANSISTOR
(1a, 1b, 1c ORGANIC THIN FILM TRANSISTOR)

ORGANIC THIN FILM TRANSISTOR, PRODUCTION METHOD THEREOF, AND ELECTRONIC DEVICE

BACKGROUND OF THE INVENTION

1. Field of the Invention

The present invention relates to an organic thin film transistor, a production method thereof, and an electronic device. More particularly, the invention relates to a bottom-contact type organic thin film transistor formed of a source electrode and drain electrode with an organic semiconductor layer formed thereon, a production method of the organic thin film transistor, and an electronic device provided with the organic thin film transistor.

2. Description of the Related Art

Thin film transistors using an organic semiconductor layer as an active layer, the so-called organic thin film transistors, have been attracting much attention in recent years. Since the organic semiconductor layer as the active layer in the organic thin film transistor can be formed by a film coating method at relatively low temperatures, this is advantageous for reducing production costs, also enables its formation on a flexible, low heat-resistant substrate made of plastic and so forth. In addition, not only for the active layer, but also for a gate insulating film, source/drain electrode, and gate electrode, the patterning formation becomes feasible by employing the printing method using coating agent materials, thereby allowing a further reduction of production costs to be feasible, as well as allowing a large increase in the substrate size.

In order to improve transistor characteristics in the organic thin film transistor mentioned above, it is important to employ a source/drain electrode which can achieve a good ohmic contact with the organic semiconductor layer. As the materials suitable for forming such source/drain electrode among inorganic materials, gold (Au), platinum (Pt), and also palladium (Pd) have been utilized, for example. These materials are known to yield satisfactory ohmic contact with p-type organic semiconductors. In addition, as to organic materials there reported is the use of poly-ethylenedioxythiophene and polystyrene sulphonic acid in combination, doped polyaniline, carbon nanotube, and so forth.

Moreover, the methods of forming the source/drain electrode aimed at extended device life have been also proposed. In this case, a base layer formed of titanium nitride ($TiN_x$) or conductive paste is disposed by a patterning method, the thus formed pattern is subsequently subjected to the formation of a nickel (Ni) layer by electroless plating method, and further the surface of the Ni layer is displaced by Au employing displacement plating techniques. As a result, the source/drain electrode is formed having the structure with the base layer formed of titanium nitride ($TiN_x$) or conductive paste which is covered with Au layer through Ni layer (see, for example, Japanese Unexamined Patent Application Publication No. 2001-203364).

SUMMARY OF THE INVENTION

However, several problems have been encountered in the organic thin film transistors provided with the source/drain electrode having the abovementioned structure, which follows.

That is, the materials such as Au, Pt, and Pd, which are known as being capable of achieving satisfactory ohmic contact with p-type organic semiconductor, are relatively expensive. It is therefore not suitable to use such materials in large quantities in view of reducing production costs of organic thin film transistors. In addition, in the case where these materials are deposited on an organic insulating film by an existing sputtering method, damage may be caused to underlying layers by high energy molecules included in plasma and high energy metal species generated by high temperatures and the intense electric field. As a result, the use of these metals is not suitable only for producing a top-contact type organic thin film transistor which includes an organic semiconductor layer as an underlying layer, but also for a bottom-contact type organic thin film transistor which includes a gate insulating film and a substrate as underlying components each formed of organic material.

Furthermore, while several organic materials such as doped polyaniline, carbon nanotube, and so forth are known to be deposited by coating process, and also to be capable of yielding satisfactory ohmic contact with p-type organic semiconductors, these are not satisfactory in electrical conductivity. Therefore, in electric devices in which the wirings are provided on the same layer as the source/drain electrode, these wirings may not be formed with the same structure as the source/drain electrode having insufficient conductivity. This has been one the obstacles to adopt organic materials as the compositional material for forming the source/drain electrode.

In the methods of forming the source/drain electrode described in the abovementioned Application Publication, the base layer is configured to be first formed using titanium nitride ($TiN_x$) or conductive paste. In the formation of the base layer using $TiN_x$ among the methods, the deposition is carried out by the sputtering method, and in this sputtering method there arises the phenomenon in which metal atoms diffuse into underlying layers. Also in the method of forming the base layer using conductive paste, a similar phenomenon of the diffusion of metal atoms into underlying layers takes place during firing process subsequent to the pattern printing of the conductive paste. Such diffusion of metal atoms into underlying layers could become one of the factors degrading device characteristics.

It is desirable, therefore, to make it possible to form a source electrode and drain electrode at low costs without causing damage to an underlying insulating layer containing organic materials, and at the same time achieve good ohmic contact with an organic semiconductor layer formed over the electrodes. With the thus provided electrode structures, it is also desirable in the present invention to provide an organic thin film transistor with excellent device characteristics while retaining low production costs, a method of producing the organic thin film transistor, and an electronic device incorporating the organic thin film transistor.

According to an embodiment of the present invention, there is provided an organic thin film transistor including an organic insulating layer, a source electrode and a drain electrode each formed thereon, and an organic semiconductor layer formed over a region between the source electrode and the drain electrode. In particular, the source electrode and the drain electrode are each formed including a first layer and a second layer covering the first layer. The first layer is deposited on the organic insulating layer using a plating technique. In addition, the second layer is deposited including a metal material which is capable of forming an ohmic contact with an organic semiconductor material lower than the first layer, covering the first layer using a further plating technique.

According to an embodiment of the present invention, there is provided a method of producing an organic thin film transistor including the following process steps. In the first process step, a metal material film is deposited on an organic insulating layer using electroless plating technique. In the second step, a first layer for forming a source electrode and drain electrode is deposited by carrying out patterning of the metal material film. In the third step, a second layer for forming the source electrode and drain electrode is deposited including a metal material on the exposed surface of the first layer using a further plating technique, in which the metal material is capable of forming an ohmic contact with an organic semiconductor material lower than the first layer. Accordingly, the source electrode and drain electrode are each formed including the first layer and second layer. Thereafter in the fourth step, an organic semiconductor layer is formed over a region between the source electrode and drain electrode.

According to an embodiment of the present invention, there is provided an electric device incorporating the organic thin film transistor of the abovementioned configuration.

In the configuration mentioned above, since the surface of the first layer is covered with the second layer, the second layer is configured to be in contact with the organic semiconductor layer. In addition, since this is configured so that the first layer is covered with the second layer including the metal material which is capable of forming low ohmic contact with the organic semiconductor material, no ohmic characteristic is necessary for the first layer and the construction with low cost materials becomes feasible. Further, since the first layer is formed including the metal material, this yields excellent conductivity. Furthermore, both the first layer and second layer, which constitute the source electrode and drain electrode by covering the first layer with the second layer, are formed of films with plated layers. As a result, the source electrode and drain electrode are formed without causing damage by sputtering and/or firing process to underlying layers.

As described hereinabove according to the embodiments of the present invention, it becomes feasible to form the source and drain electrodes at low casts without causing the damage to underlying insulating layers formed of organic materials, and achieving good ohmic contact with the organic semiconductor layer formed over the electrodes. In addition, with the thus formed electrodes, it becomes also possible to provide the organic thin film transistor having excellent device characteristics while retaining low production costs, and also electronic devices incorporating the organic thin film transistor.

DESCRIPTION OF THE PREFERRED EMBODIMENTS

Several embodiments adapted to the present invention will be described hereinbelow with reference to the accompanying drawings. The configuration an organic thin film transistor and the method of producing the organic thin film transistor will be explained in that order through the first and third embodiments, and further a display device as an embodiment adapted to electronic devices will be described afterward.

<<Configuration of Organic Thin Film Transistor According to First Embodiment>>

Figure 1A:
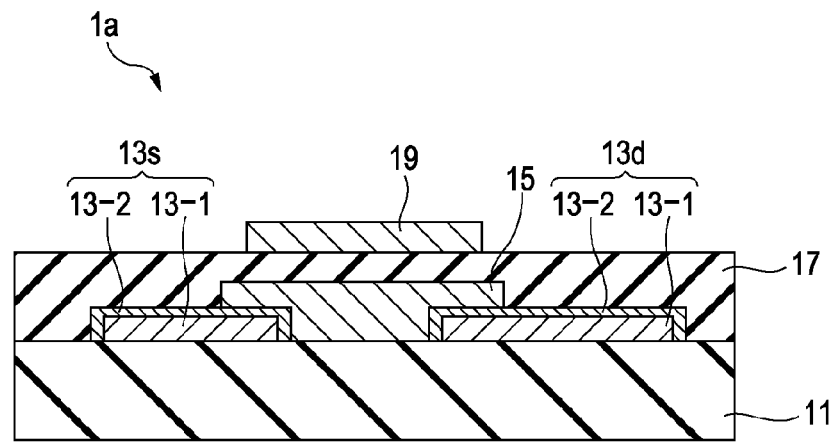
FIG. 1A is a cross-sectional view of an organic thin film transistor according to a first embodiment.
Figure 1B:
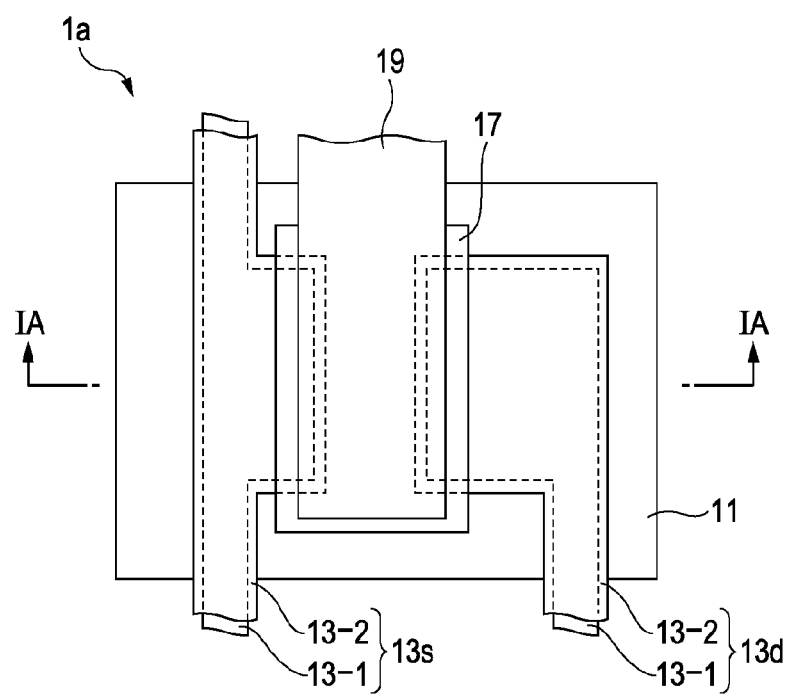
FIG. 1B is a plan view of the organic thin film transistor of the first embodiment.

FIG. 1A is a cross-sectional view of an organic thin film transistor according to a first embodiment and FIG. 1B is a plan view of the organic thin film transistor of the first embodiment. FIG. 1A is the sectional view taken along the line A-A' of the structure of FIG. 1B.

An organic thin film transistor 1a shown in these drawings is configured to be a top-gate bottom-contact type thin film transistor, and is provided with a source electrode 13s and a drain electrode 13d, an organic semiconductor layer 15, a gate insulating film 17, and a gate electrode 19, sequentially in that order from the side of a substrate 11. Each of the source electrode 13s and drain electrode 13d is formed, in particular, as a stacked structure formed of a first layer 13-1 and second layer 13-2. There will be explained hereinbelow in detail the structure sequentially from the side of the substrate 11.

The substrate 11 is formed, including a structure either integrally formed of an organic insulating layer like a plastic, for example, or a supporting substrate formed of a glass substrate or a quartz plate and so forth, the surface of which is covered with an organic insulating layer. Preferable materials for forming the organic insulating layer covering the surface side of the supporting substrate include organic materials such as PVP (polyvinylphenol), PMMA (polymethylmethacrylate), for example, and a coating composition formed as a mixture of PVP and OTS (octadeciltriclorosilane). By way of example, used herein is the substrate 11 formed of a flexible and flexuous plastic.

Among the layers which constitute the source electrode 13s and drain electrode 13d provided on the substrate 11, the first layer 13-1 includes a layer which is formed by film plating process on the substrate 11 as an insulating layer of organic materials. This first layer 13-1 is formed of metal materials with satisfactory electrical conductivity such as, for example, tungsten (W), tantalum (Ta), molybdenum (Mo), aluminum (Al), chromium (Cr), titanium (Ti), copper (Cu), nickel (Ni), and so forth. Among these materials, particularly preferred is the layer sustaining good conductivity, which is formed including at least one of Ni and Cu individually or in combination as an alloy. The first layer 13-1 is subjected to a patterning process to be formed in the shape of the source electrode 13s and drain electrode 13d.

In addition, the second layer 13-2 is configured to be formed including metal materials, which are capable of forming an ohmic contact with the organic semiconductor layer 15 including of organic semiconductor material, lower than the first layer 13-1. In the case where the organic semiconductor layer 15 is of p-type semiconductor, for example, preferable metal materials for use in forming such second layer 13-2 include at least one of gold (Au), platinum (Pt), and the palladium (Pd), individually or in combination as an alloy. Moreover, the second layer 13-2 is formed as a layer by film plating process so as to cover the surface of the layer 13-1, thereby provided covering the entire exposed surface of the first layer 13-1 disposed on the substrate 11.

The organic semiconductor layer 15 is formed covering a region between the source electrode 13s and drain electrode 13d. It is important for this organic semiconductor layer 15 to be formed on the substrate 11, being in contact with the second layers 13-2 respectively formed on the source electrode 13s and drain electrode 13d which have been disposed opposing to each other. The organic semiconductor layer 15 is configured to be subjected to patterning process for forming an island structure on the substrate 11 so as to provide the device isolation from neighboring organic thin film transistors 1a, which is omitted herein from drawing. Such organic semiconductor layer 15 is configured to be formed, including p-type semiconductors such as, herein for example, pentacene, polythiophene, polyfluorene, rubrene, and so forth.

The gate insulating film 17 is formed together with the organic semiconductor layer 15, covering the substrate 11 on which the source electrode 13s and drain electrode 13d are provided. For forming the gate insulating film 17, organic polymer materials, which are capable of forming films by coating or printing process, are preferably used such as exemplified by polyvinylphenol, PMMA, polyimide, fluororesin, and so forth. Moreover, the gate insulating film 17 may alternatively be formed including a multilayer film of inorganic materials and organic polymer materials, the former being those suitably formed as film by CVD or sputtering method such as silicon oxide, silicon nitride, and so forth.

Moreover, it is important for the gate electrode 19 formed on the gate insulating film 17 to be disposed on the organic semiconductor layer 15 covering the region between the source electrode 13s and drain electrode 13d which have been formed opposing to each other. The gate electrode 19 may preferably be formed by suitably patterning metal material films which are deposited by sputtering, evaporating, or plating metal materials such as W, Ta, Mo, Al, Cr, Ti, Cu, Ni, and so forth. In addition, the gate electrode 19 may alternatively be formed by patterning through printing techniques such as ink-jet, screen-stencil, offset, gravure printing, and so forth, using ink-paste which is prepared by containing gold (Au) particulates, silver (Ag) particulates, and so forth.

<<Method of Producing Organic Thin Film Transistor According to First Embodiment>>

FIGS. 2A through 2F are cross-sectional views illustrating production process steps of the organic thin film transistor having the abovementioned configuration. Referring to the cross-sectional views, the production method of the organic thin film transistor 1a of the first embodiment will be explained hereinbelow.

Figure 2A:
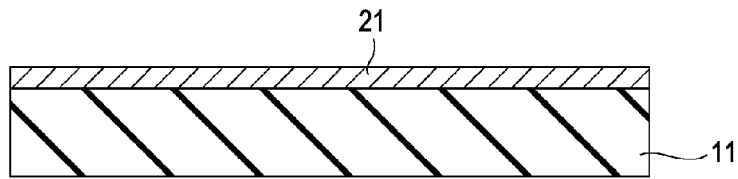
FIGS. 2A through 2F are cross-sectional views illustrating production process steps of the organic thin film transistor according to the first embodiment.

In the first place, referring to FIG. 2A, a substrate 11 is provided, which includes an insulating layer made of an organic material at least as the surface of the substrate (such as a plastic substrate, for the present example). The surface thereof is subjected to catalytic treatment by soaking in a solution containing a palladium salt or silver salt so that the subsequent electroless plating step can be performed effectively. In addition, prior to the catalytic treatment and in order to carry out such catalytic treatment efficiently, the surface of substrate 11 is either subjected to aminosilane coupling processing, or coated with resin containing an aminosilane coupling agent.

Thereafter, a metal material film 21 is formed containing at least one of Ni and Cu by electroless plating method over the entire surface of the substrate 11.

For depositing the metal material film 21 containing Ni, for example, electroless Ni plating steps are carried out using an aqueous solution as electroless plating solution, containing nickel sulfate 25 g/l, sodium hypophosphite 20 g/l, sodium acetate 10 g/l, and sodium citrate 10 g/l. In contrast, for depositing the metal material film 21 containing Cu, electroless Cu plating steps are carried out using another aqueous solution as electroless plating solution, containing copper sulfate 10 g/l, formalin 20 ml/l, sodium hydroxide 10 g/l, and EDTA$_4$Na 25 g/l.

Incidentally, as long as the metal material film 21 is endowed with good conductivity as the film deposited on the substrate 11 by the plating method, an alloy containing Ni and Cu may suitably be used. Furthermore, a metal material film of W, Ta, Mo, Al, Cr, Ti, and so forth may alternatively be used.

Figure 2B:
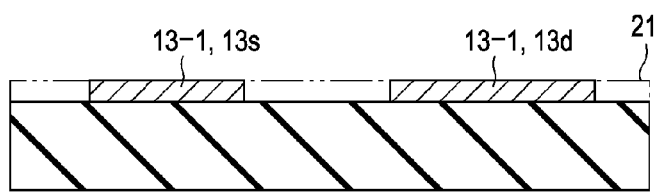

Thereafter, as illustrated in FIG. 2B, a resist pattern (not shown) is formed over the metal material film 21 by photolithography method, and etching steps are carried out on the metal material film 21 using the resist pattern as a mask. Thus, a pattern formation of the first layers 13-1 for forming a source electrode (13s) and drain electrode (13d) is carried out on the substrate 11. In this case, for etching the metal material film 21 including Ni, for example, wet etching steps are carried out using aqueous solution of the mixed acid containing nitric acid, sulfuric acid, and phosphoric acid, as an etchant. In addition, on completing the etching, the resist pattern is removed.

Figure 2C:
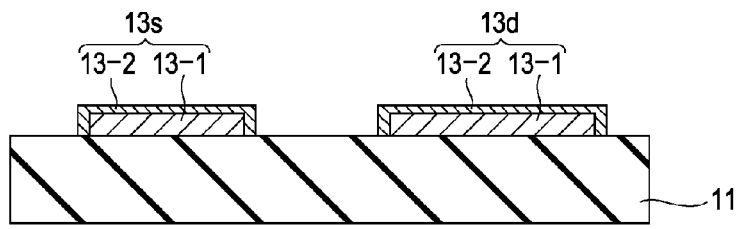

Next, referring to FIG. 2C, by dipping the exposed surface of the first layer 13-1 into an aqueous solution of potassium gold cyanide and ammonia, a second layer 13-2 is formed as a result of the displacement plating of Au onto the exposed surface of the first layer 13-1 containing Ni and Cu. Other than the abovementioned Au plated layer, the second layer 13-2 may alternatively be formed as Pt plated layer or Pd plated layer, or as another plated layer of alloy containing these metals. Moreover, the method of forming the second layer 13-2 is not limited to the abovementioned methods of displacement plating onto the exposed surface of the first layer 13-1, but another method such as electroless plating process may alternatively be used for precipitating metal materials only on the exposed surface of the first layer 13-1.

Through the abovementioned process steps, the source electrode 13s and drain electrode 13d are formed by covering the exposed surface of the first layer 13-1 with the second layer 13-2, in which the first layer has been rendered to the pattern formation on the substrate 11.

Figure 2D:
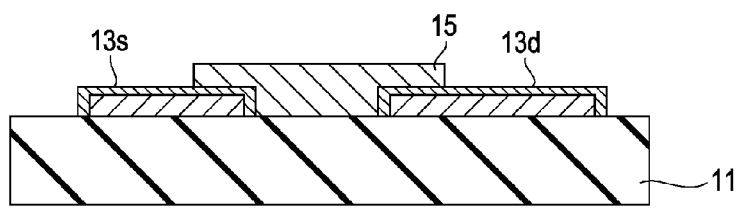

Subsequently, referring to FIG. 2D, an organic semiconductor layer 15 is formed as a pattern covering the region between the source electrode 13s and drain electrode 13d on the substrate 11. If necessary, a bank (i.e., embankment, not shown) is formed through patterning process in the shape surrounding the region for forming the organic semiconductor layer 15. Thereafter, the organic semiconductor layer 15 is formed on the predetermined location over the region between the source electrode 13s and drain electrode 13d using the evaporation method, coating method, ink-jet method, and/or printing techniques such as screen-stencil, offset, and further gravure printing.

Figure 2E:
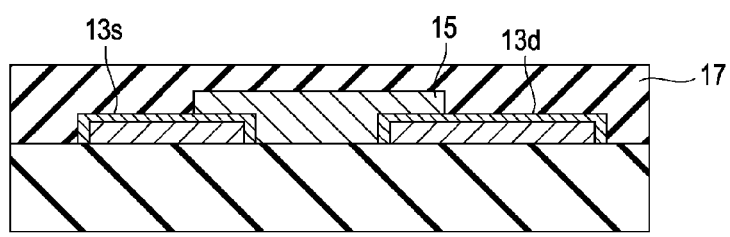

Subsequent to the abovementioned steps, referring to FIG. 2E, a gate insulating film 17 is formed together with the organic semiconductor layer 15, covering the source electrode 13s and drain electrode 13d. For forming the gate insulating film 17, organic polymer materials, which are capable of forming films by coating or printing process, are preferably used as exemplified by polyvinylphenol, PMMA, polyimide, fluororesin, and so forth. Moreover, the gate insulating film 17 may alternatively be formed including a multilayer film of inorganic materials and organic polymer materials, the former being those suitably deposited by CVD or sputtering method such as silicon oxide, silicon nitride, and so forth.

Subsequent to the abovementioned steps, referring to FIG. 2E, a gate insulating film 17 is formed together with the organic semiconductor layer 15, covering the source electrode 13s and drain electrode 13d. In this case, for forming the gate insulating film 17 including inorganic materials such as silicon oxide, silicon nitride, and so forth, the deposition of the film by CVD or sputtering method is carried out. On the other hand, for forming the gate insulating film 17 including organic polymer materials such as polyvinylphenol, PMMA, polyimide, fluororesin, and so forth, the deposition of the film either by coating or printing method is performed.

Figure 2F:
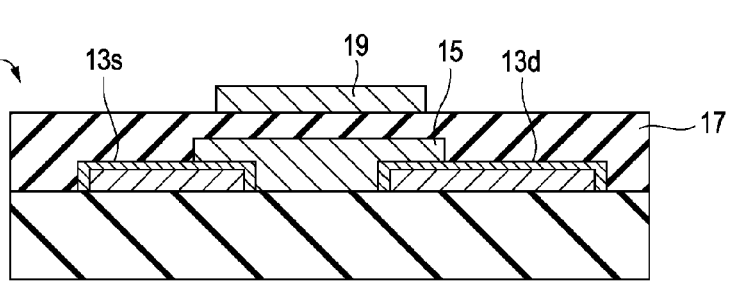

Next, referring to FIG. 2F, a gate electrode 19 is formed over the organic semiconductor layer 15 through the gate insulating film 17. In this case, a metal material film is first formed, for example, by depositing metal materials such as W, Ta, Mo, Al, Cr, Ti, Cu, Ni, and so forth by sputtering, evaporation or plating method. Thereafter, a resist pattern (not shown) is formed over the metal material film through photolithography steps, and the etching of the metal material film is performed using the resist pattern as a mask. Thus, a pattern formation of the gate electrode 19 on the gate insulating film 17 is carried out. In addition, as an alternative method, the pattern formation of the gate electrode 19 may be carried out by printing methods such as ink-jet, screen-stencil, offset, gravure printing, and so forth, using ink-paste which is prepared by containing Au particulates, Ag particulates, and so forth.

Through the abovementioned process steps, the organic thin film transistor 1a is formed with the configuration described in reference to FIGS. 1A and 1B. Incidentally, in order to improve the reliability and environmental resistance of the transistor, it is preferable to encapsulate the thin film transistor 1a with a protective film formed of polyvinyl alcohol, perylene, silicon nitride or silicon oxide, etc.

According to the first embodiment described hereinabove, therefore, in regard to the bottom-contact type organic thin film transistor 1a, the source electrode 13s and drain electrode 13d are configured so that the first layer 13-1 included therein is covered with the second layer 13-2 formed of metal materials which are capable of forming low ohmic junction with respect to the organic semiconductor material. As a result, no ohmic characteristic is necessary for the first layer 13-1 and the construction with low cost materials becomes feasible. In addition, since the first layer 13-1 is formed including metal materials, this yields excellent conductivity. Furthermore, both the first layer 13-1 and second layer 13-2, which constitute the source electrode 13s and drain electrode 13d by covering the first layer with the second layer, are formed of films with plated layers. As a result, the source electrode 13s and drain electrode 13d are formed without causing damage by sputtering and/or firing process to the substrate 11 including its underlying organic insulating layers.

From these results abovementioned, therefore, it is feasible to form the source electrode 13s and drain electrode 13d at low costs without causing the damage to the surface of the substrate 11 containing organic materials, and at the same time, to achieve good ohmic contact with the organic semiconductor layer 15 which is formed overlying these electrodes. Moreover, this makes it feasible to form the organic thin film transistor 1a with excellent device characteristics at low costs.

<<Configuration of Organic Thin Film Transistor According to Second Embodiment>>

Figure 3A:
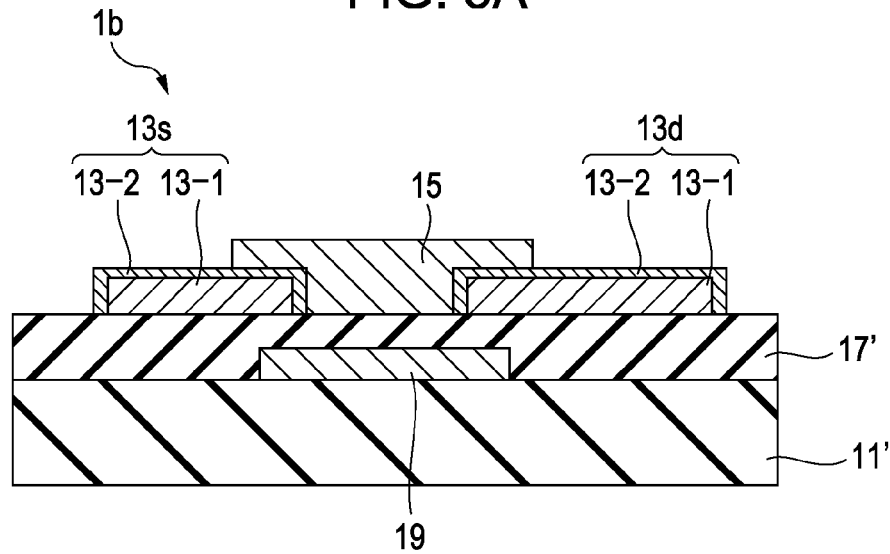
FIG. 3A is a cross-sectional view of an organic thin film transistor according to a second embodiment.
Figure 3B:
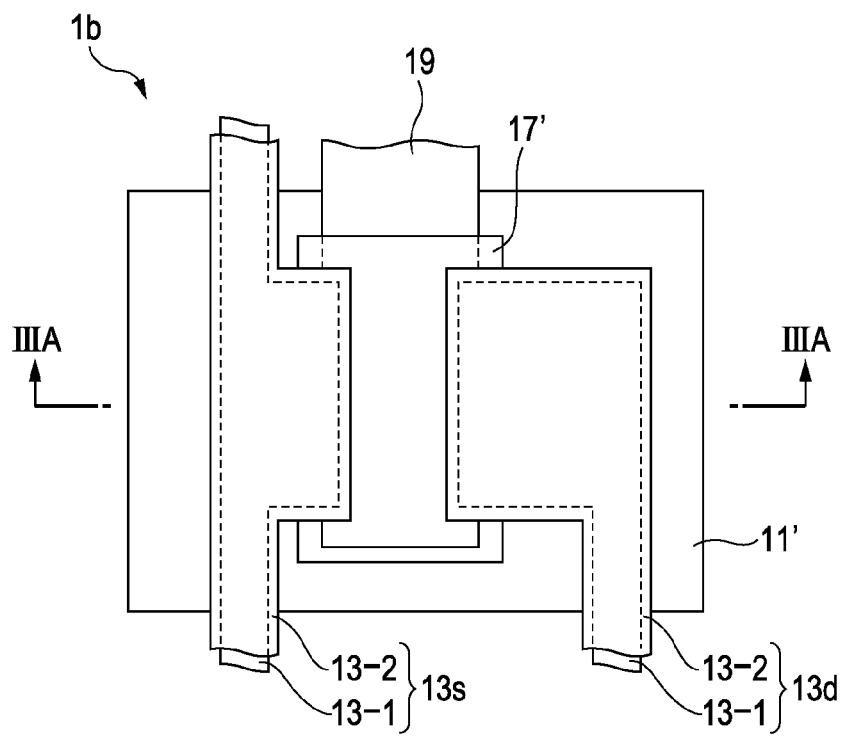
FIG. 3B is a plan view of the organic thin film transistor of the second embodiment.

FIG. 3A is a cross-sectional view of an organic thin film transistor according to a second embodiment and FIG. 3B is a plan view of the organic thin film transistor of the second embodiment. FIG. 3A is the sectional view taken along the line IIIA-IIIA of the structure of FIG. 3B. The configuration of an organic thin film transistor 1b according to the second embodiment is explained hereinbelow, in which the components similar to those of the organic thin film transistor of the first embodiment described earlier referring to FIGS. 1A and 1B are shown with identical numerical representations.

The organic thin film transistor 1b shown in FIGS. 3A and 3B is configured to be a bottom-gate bottom-contact type thin film transistor, and is provided with a gate electrode 19, a gate insulating film 17', a source electrode 13s, a drain electrode 13d, and an organic semiconductor layer 15, sequentially in that order from the side of a substrate 11'. Similarly to the first embodiment, each of the source electrode 13s and drain electrode 13d is formed, in particular, as a stacked structure including a first layer 13-1 and second layer 13-2. There will be explained hereinbelow the structure in detail sequentially from the side of the substrate 11'.

The substrate 11' may suitably be formed, including an insulating layer at least as the surface of the substrate such as, for example, using a plastic substrate, a glass substrate, a quartz plate and further substrates, the surface of which on the side of supporting substrate is covered with an organic or inorganic insulating layer. By way of example, used herein is the substrate 11' formed of a flexible and flexuous plastic.

The gate electrode 19 provided on the substrate 11' may be formed in a manner similar to that of the first embodiment and it is important to be disposed covering the region between the source electrode 13s and drain electrode 13d which have been formed opposing to each other over the gate electrode. This gate electrode 19 may preferably be formed by suitably patterning metal material films which are deposited by sputtering, evaporating, or plating metal materials such as W, Ta, Mo, Al, Cr, Ti, Cu, Ni, and so forth. In addition, the gate electrode 19 may alternatively be formed by patterning through printing techniques such as ink-jet, screen-stencil, offset, gravure printing, and so forth, using ink-paste which is prepared by containing Au particulates, Ag particulates, and so forth.

The gate insulating film 17' is formed as an organic insulating layer to cover the substrate 11' which has been provided thereon with the gate electrode 19. For forming the gate insulating film 17', organic polymer materials, which are capable of forming films by coating or printing process, are preferably used such as exemplified by polyvinylphenol, PMMA, polyimide, fluororesin, and so forth. Moreover, the gate insulating film 17' may alternatively be formed including a multilayer film of inorganic materials and organic polymer materials, the former being those suitably formed as film by CVD or sputtering method such as silicon oxide, silicon nitride, and so forth.

The first layer 13-1 and second layer 13-2 for constituting the source electrode 13s and drain electrode 13d provided on the gate insulating film 17' are formed in a manner similar to the first embodiment. Namely, the first layer 13-1 includes a layer which is formed by film plating process on the gate insulating film 17' as an insulating layer of organic materials. This first layer 13-1 is formed using metal materials having satisfactory electrical conductivity such as, for example, W, Ta, Mo, Al, Cr, Ti, Cu, Ni, and so forth. Among these materials, particularly preferred is the layer sustaining good conductivity, which is formed including at least one of Ni and Cu individually or in combination as an alloy. The first layer 13-1 is subjected to patterning process to be formed in the shape of the source electrode 13s and drain electrode 13d.

In addition, the second layer 13-2 is configured to be formed including metal materials which are capable of forming an ohmic contact with the organic semiconductor layer 15 lower than the first layer 13-1. In the case where the organic semiconductor layer 15 is of p-type semiconductor, for example, preferable metal materials for use in forming such second layer 13-2 include at least one of Au, Pt, and Pd, individually or in combination as an alloy. Moreover, the second layer 13-2 is formed as a layer by film plating process so as to cover the surface of the layer 13-1, thereby provided covering the entire exposed surface of the first layer 13-1 disposed on the substrate 11'.

The organic semiconductor layer 15 is formed covering the region between the source electrode 13s and drain electrode 13d. It is important for this organic semiconductor layer 15 to be formed on the gate insulating film 17', being in contact with the second layers 13-2 respectively formed on the source electrode 13s and drain electrode 13d which have been disposed opposing to each other. Further, the organic semiconductor layer 15 is configured to be subjected to patterning process for forming an island structure on the gate insulating film 17' so as to provide the device isolation from neighboring organic thin film transistors 1b which is omitted herein from drawing. Such organic semiconductor layer 15 is configured to be formed, including p-type semiconductors such as, for example herein, pentacene, polythiophene, polyfluorene, rubrene, and so forth.

<<Method of Producing Organic Thin Film Transistor According to Second Embodiment>>

FIGS. 4A through 4F are cross-sectional views illustrating production process steps of the organic thin film transistor having the configuration mentioned above. Referring to the cross-sectional views, the production method of organic thin film transistor 1b of the second embodiment will be explained hereinbelow.

Figure 4A:
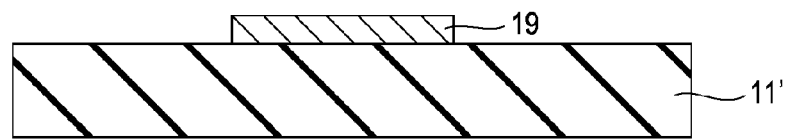
FIGS. 4A through 4F are cross-sectional views illustrating production process steps of the organic thin film transistor according to the second embodiment.

In the first place, as shown in FIG. 4A, a substrate 11' is prepared, which includes an insulating layer at least as the surface of the substrate. A gate electrode 19 is formed on the substrate. In this case, a metal material film is first formed, for example, by depositing metal materials such as W, Ta, Mo, Al, Cr, Ti, Cu, Ni, and so forth by sputtering, evaporation or plating method. Thereafter, a resist pattern (not shown) is formed over the metal material film with photolithography steps, and the etching of the metal material film is performed using the resist pattern as a mask. Thus, a pattern formation of the gate electrode 19 on the substrate 11' is carried out. In addition, as an alternative method, the pattern formation of the gate electrode 19 may be carried out by printing methods such as ink-jet, screen-stencil, offset, gravure printing, and so forth, using ink-paste which is prepared by containing Au particulates, Ag particulates, and so forth.

Figure 4B:
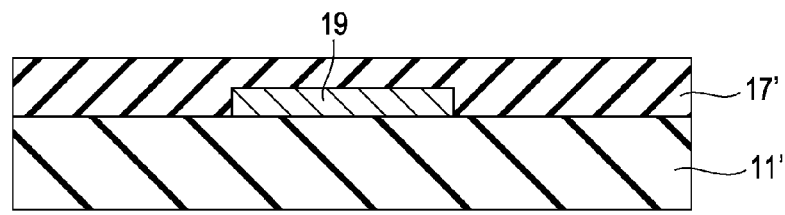

Subsequent to the abovementioned steps, referring to FIG. 4B, a gate insulating film 17' is formed as an organic insulating layer on the substrate 11', covering the gate electrode 19. In this case, organic polymer materials such as, for example, polyvinylphenol, PMMA, polyimide, fluororesin, and so forth are deposited to form the film by coating or printing process. The gate insulating film 17' may alternatively be formed including inorganic materials such as silicon oxide, silicon nitride, and so forth deposited by CVD or sputtering method, and further including multilayer films of organic polymer materials and inorganic materials in combination with the abovementioned methods.

Next, the surface of the gate insulating film 17' is subjected to catalytic treatment by soaking in a solution containing a palladium salt or silver salt so that the subsequent electroless plating step can be performed effectively. In addition, prior to the catalytic treatment and in order to carry out such catalytic treatment efficiently, the surface of the gate insulating film 17' is either subjected to aminosilane coupling processing, or coated with resin containing an aminosilane coupling agent. In the case where the gate insulating film 17' is formed including organic polymer materials, the aminosilane coupling agent may be mixed in advance with the gate insulating film 17'.

Figure 4C:
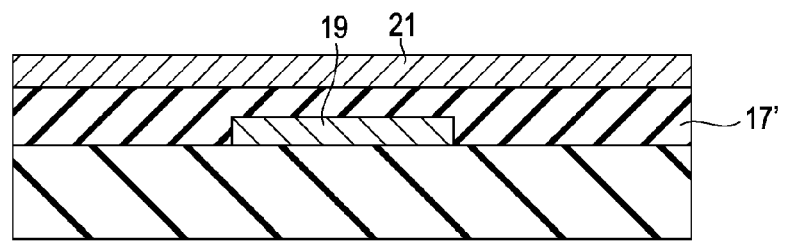

Thereafter, as shown in FIG. 4C, a metal material film 21 is formed containing at least one of Ni and Cu by electroless plating method over the entire surface of the gate insulating film 17'.

For example, for depositing the metal material film 21 containing Ni, electroless Ni plating steps are carried out using an aqueous solution as electroless Ni plating solution, containing nickel sulfate 25 g/l, sodium hypophosphite 20 g/l, sodium acetate 10 g/l, and sodium citrate 10 g/l. In contrast, for depositing the metal material film 21 containing Cu, electroless Cu plating steps are carried out using another aqueous solution as Cu electroless plating solution, containing copper sulfate 10 g/l, formalin 20 ml/l, sodium hydroxide 10 g/l, and EDTA$_4$Na 25 g/l.

Incidentally, as long as the metal material film 21 is endowed with good conductivity as the film deposited on the gate insulating film 17' by the plating method, an alloy containing Ni and Cu may suitably be used. Furthermore, a metal material film of W, Ta, Mo, Al, Cr, Ti, and so forth may alternatively be used.

Figure 4D:
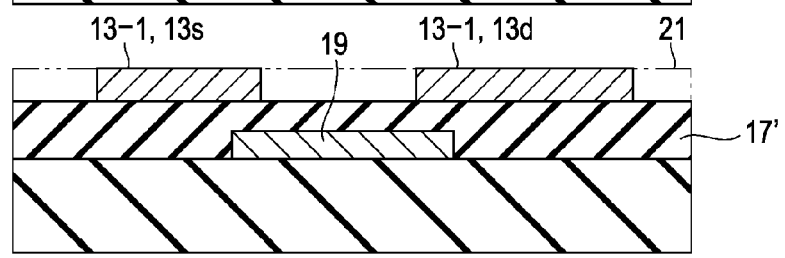

Thereafter, as illustrated in FIG. 4D, a resist pattern (not shown) is formed over the metal material film 21 by photolithography method, and etching steps are carried out on the metal material film 21 using the resist pattern as a mask. Thus, a pattern formation of the first layers 13-1 for forming a source electrode (13s) and drain electrode (13d), is carried out on the gate insulating film 17'. In this case, for etching the metal material film 21 including Ni, for example, wet etching steps are carried out using an aqueous solution of the mixed acid containing nitric acid, sulfuric acid, and phosphoric acid, as an etchant. In addition, on completing the etching, the resist pattern is removed.

Figure 4E:
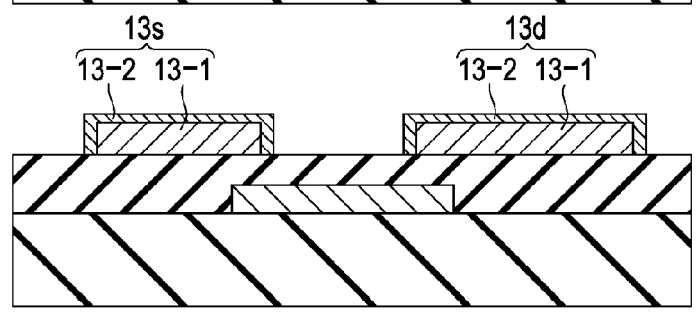

Next, referring to FIG. 4E, by dipping the exposed surface of the first layer 13-1 into an aqueous solution of potassium gold cyanide and ammonia, a second layer 13-2 is formed as a result of the displacement plating of Au onto the exposed surface of the first layer 13-1 containing Ni and Cu. In addition, other than the abovementioned Au plated layer, the second layer 13-2 may alternatively be formed as Pt plated layer or Pd plated layer, or as another plated layer of alloy containing these metals. Moreover, the method of forming the second layer 13-2 is not limited to the abovementioned methods of displacement plating onto the exposed surface of the first layer 13-1, but another method such as electroless plating process may alternatively be used for precipitating metal materials only on the exposed surface of the first layer 13-1.

Through the abovementioned process steps, the source electrode 13s and drain electrode 13d are formed by covering the exposed surface of the first layer 13-1 with the second layer 13-2, in which the first layer has been subjected to the pattern formation on the gate insulating film 17' as the organic insulating layer.

Subsequently, referring to FIG. 4F, an organic semiconductor layer 15 is formed as a pattern covering the region between the source electrode 13s and drain electrode 13d on the gate insulating film 17'. If necessary, a bank (i.e., embankment, not shown) is formed through patterning process in the shape surrounding the region for forming the organic semiconductor layer 15. Thereafter, the organic semiconductor layer 15 is formed on the predetermined location over the region between the source electrode 13s and drain electrode 13d using the evaporation method, coating method, ink-jet method, and/or printing techniques such as screen-stencil, offset, and further gravure printing. In the case where the bank has been formed, by removing the bank after forming the organic semiconductor layer 15, the organic semiconductor layer 15 is formed into the shape defined by the surrounding bank with excellent shape accuracy.

Through the abovementioned process steps, the organic thin film transistor 1b is formed with the configuration described in reference to FIGS. 3A and 3B. In order to improve the reliability and environmental resistance of the transistor, it is preferable to encapsulate the thin film transistor 1b with a protective film formed of polyvinyl alcohol, perylene, silicon nitride or silicon oxide, etc.

According to the second embodiment described above in the bottom-contact type organic thin film transistor 1b, the source electrode 13s and drain electrode 13d are configured so that the first layer 13-1 included therein is covered with the second layer 13-2 formed of metal materials which are capable of forming the low ohmic contact with the organic semiconductor material. As a result, in a manner similar to that of the first embodiment, none of ohmic characteristics is necessary for the first layer 13-1 and the construction with low cost materials becomes feasible. In addition, since the first layer 13-1 is formed including metal materials, this yields excellent conductivity. Furthermore, both the first layer 13-1 and second layer 13-2, which constitute the source electrode 13s and drain electrode 13d by covering the first layer 13-1 with the second layer 13-2, are formed of films with plated layers. As a result, the source electrode 13s and drain electrode 13d are formed without causing damage by sputtering and/or firing process to the gate insulating film 17' as the underlying organic insulating layer.

From these results mentioned above, it is feasible to form the source electrode 13s and drain electrode 13d at low costs without causing the damage to the surface of the gate insulating film 17' containing organic materials, and at the same time, to achieve good ohmic contact with the organic semiconductor layer 15 which is formed overlying these electrodes. Moreover, this makes it feasible to form the organic thin film transistor 1b with excellent device characteristics at low costs.

<<Configuration of Organic Thin Film Transistor According to Third Embodiment>>

Figure 5:
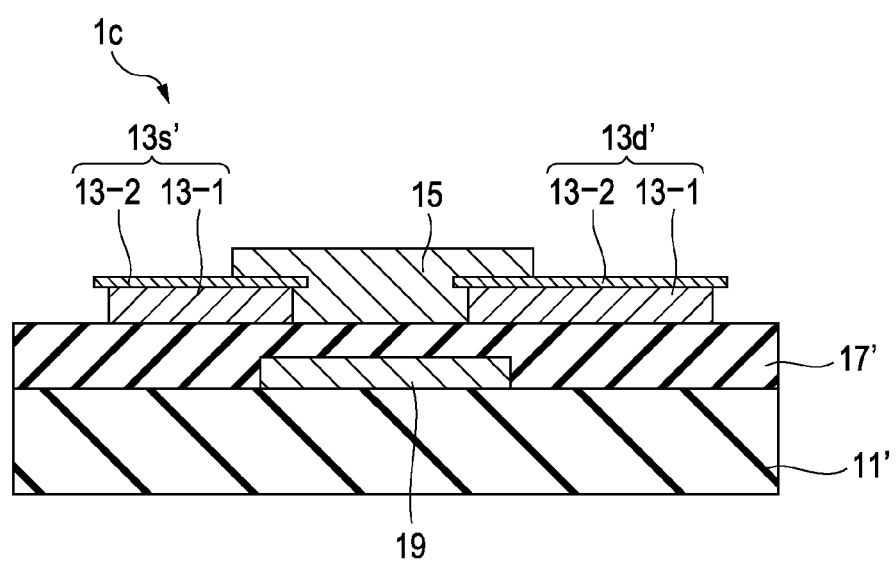
FIG. 5 is a cross-sectional view of an organic thin film transistor according to a third embodiment.

FIG. 5 is a cross-sectional view of an organic thin film transistor according to the third embodiment. In addition, a plan view of the organic thin film transistor of this third embodiment is similar to FIG. 3B shown earlier in the second embodiment, and FIG. 5 corresponds to the sectional view taken along the line A-A' of the structure of FIG. 3B. The configuration of an organic thin film transistor 1c according to the third embodiment is explained hereinbelow, in which the components similar to those of the organic thin film transistor of the second embodiment described earlier in reference to FIGS. 3A and 3B are shown with identical numerical representations.

The organic thin film transistor 1c shown in FIG. 5 of the third embodiment differs from the organic thin film transistor (1b) of the second embodiment explained in reference to FIGS. 3A and 3B, by the configuration of its source electrode 13s' and drain electrode 13d'. Other components may be provided in a manner similar to those of the organic thin film transistor (1b) of the second embodiment and the repeated description thereof is herewith omitted.

That is, the source electrode 13s' and drain electrode 13d' are each formed in the shape of stacked structure including the first layer 13-1 and second layer 13-2. The second layer 13-2 is formed to have an eaves structure overlying the first layer 13-1 so that the periphery of the second layer 13-2 is overhanging out from the edge of the first layer. Suitable materials for forming the first layer 13-1 and second layer 13-2 are similar to those of the first and second embodiments. Namely, the first layer 13-1 is formed so as to sustain the conductivity by using Ni and Cu, and the second layer 13-2 is formed as the layer capable of achieving low ohmic contact with the organic semiconductor layer 15 by using Au, Pt, Pd, and so forth.

<<Method of Producing Organic Thin Film Transistor According to Third Embodiment>>

The method of producing the organic thin film transistor 1c configured as described above is provided by changing only the steps for forming the source electrode 13s' and drain electrode 13d' among the production steps described earlier in the method according to the second embodiment.

That is, through the steps of the second embodiment explained in reference to FIGS. 4A through 4C, a gate electrode 19 and a gate insulating film 17' are formed on the substrate 11', and a metal material film 21 is formed by electroless plating method containing Ni, Cu, and so forth with good conductivity.

Thereafter, utilizing the metal material film 21 as an underlying metal material film, an overlying metal material film is stacked over the entire surface of the underlying metal material film by the displacement plating method including a plated layer of Au, Pt, or Pd. The thickness of the overlying metal material film may further be increased herein by additionally adopting the electroless plating method. Next, forming a resist pattern over the stacked metal material film formed as above by photolithography method, and pattering the stacked metal material film through etching steps using the resist pattern as a mask, thereby forming a second layer 13-2 and first layer 13-1. Subsequently, only the first layer 13-1, which is formed of the underlying metal material film 21, is subjected selectively to isotropic etching. In the case where the first layer 13-1 is formed including Ni, for example, the selective etching of the Ni containing first layer 13-1 is carried out using an aqueous solution of the mixed acid containing nitric acid, sulfuric acid, and phosphoric acid. Thus, the eaves structure of the second layer 13-2 is formed.

Figure 4F:
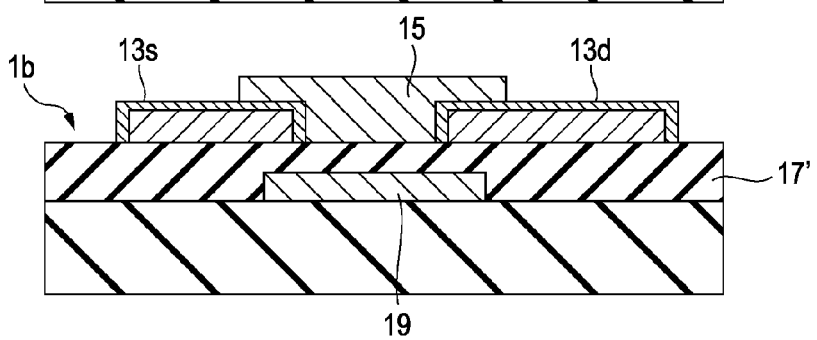

Subsequent to the abovementioned steps and through the steps similar to those of the second embodiment explained in reference to FIG. 4F, the organic semiconductor layer 15 is disposed through patterning process and the organic thin film transistor 1c is formed. In addition, in order to improve the reliability and environmental resistance of the transistor, it is preferable to encapsulate the thin film transistor 1c with a protective film formed of polyvinyl alcohol, perylene, silicon nitride or silicon oxide, etc.

According to the third embodiment described above in the bottom-contact type organic thin film transistor 1c, the source electrode 13s' and drain electrode 13d' are configured so that the second layer 13-2 is formed stacked with the first layer 13-1 to have the eaves structure overlying the first layer. In addition, the second layer 13-2 is formed of metal materials capable of achieving low ohmic contact with the organic semiconductor material. As a result, by an electric field generated between the eaves portion of the second layer 13-2 and the gate electrode 19, an excellent ohmic contact can be achieved between the eaves portion and the organic semiconductor layer 15.

Further, in a manner similar to those of the first and second embodiments, both the first layer 13-1 and second layer 13-2, which constitute the source electrode 13s' and drain electrode 13d', are formed of films with plated layers. As a result, the source electrode 13s' and drain electrode 13d' come to be formed without causing the damage by sputtering and/or firing process to the gate insulating film 17' as the underlying organic insulating layer.

From these results mentioned above, it is feasible to form the source electrode 13s' and drain electrode 13d' at low costs without causing the damage to the surface of the gate insulating film 17' containing organic materials, and at the same time, to achieve good ohmic contact with the organic semiconductor layer 15 which is formed overlying these electrodes. Moreover, this makes it feasible to form the organic thin film transistor 1c with excellent device characteristics at low costs.

<<Electronic Device>>

In the next place, the configuration of an electronic device including the organic thin film transistor explained earlier according to the abovementioned embodiments of the present invention will be described. As an example, an active matrix type display device provided with an organic electroluminescence element EL will be described hereinbelow.

Figure 6:
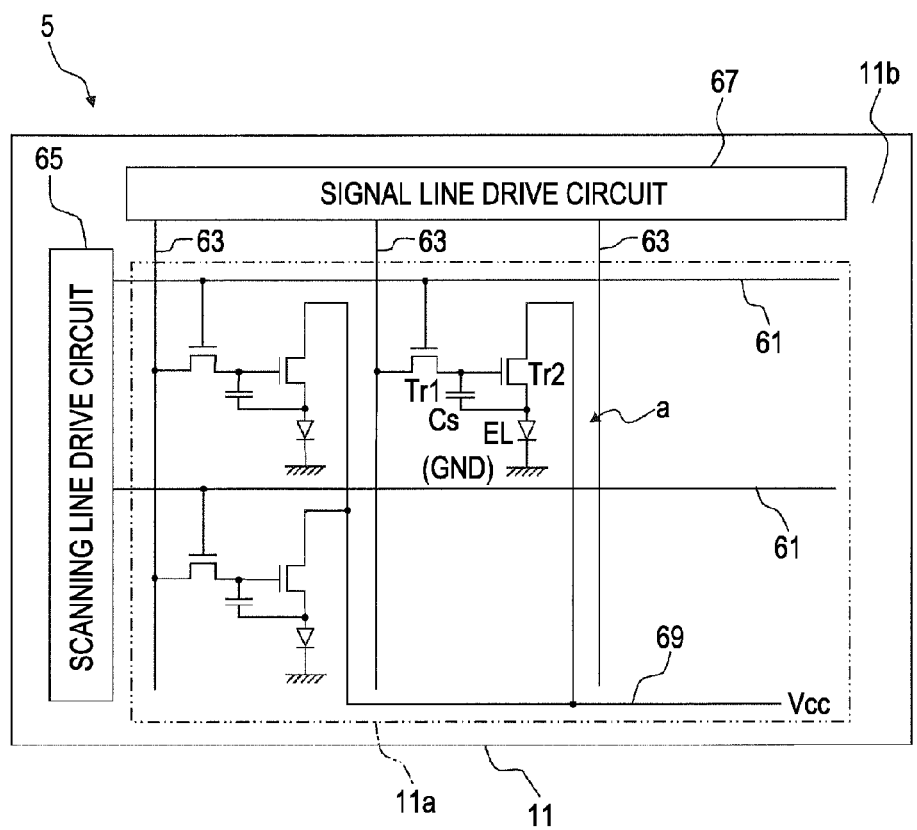
FIG. 6 is a circuit block diagram schematically illustrating a display device as an electronic device according to an embodiment of the invention.

FIG. 6 is a circuit block diagram schematically illustrating a display device 5.

As shown in the drawing, a display region 11a and a periphery region 11b are provided on a substrate 11 of the display device 5. In the display region 11a, a first plurality of scanning lines 61 and a second plurality of signal lines 63 wired lengthwise and crosswise, and one pixel "a" is formed at each crossover location of the lines, thereby forming an pixel array portion. In addition, provided in the periphery region 11b are a scanning line drive circuit 65 for carrying out the scanning drive of the scanning lines 61 and a signal line drive circuit 67 for supplying picture signals (i.e., input signals) to the signal lines 63 responsive to luminance information.

Formed at each crossover location of the scanning lines 61 and signal lines 63, a pixel circuit is provided, including a first thin film transistor Tr1 for switching, a second thin film transistor Tr2 for driving, a retentive capacitor Cs, and an organic electroluminescence element EL, for example.

In addition, by means of driving with the scanning line drive circuit 65, picture signals written from the signal lines 63 through the thin film switching transistor Tr1 is put into hold at the retentive capacitor Cs, an electrical current responsive to the amount of the signals held as above is supplied from the thin film driving transistor Tr2 to the organic electroluminescence element EL, and the organic electroluminescence element EL is exerted to emit light with the luminosity according to the current value. In addition, the thin film driving transistor Tr2 is connected to common power supply line (Vcc) 69.

Incidentally, the abovementioned configuration of pixel circuit is intended only as one of examples and alternative circuit structures may be devised such as, for example, including a capacitive element provided in the pixel circuit, if appropriate, and further providing one or more transistors for forming the pixel circuit. In addition, necessary driving circuits are additionally provided in the periphery region 11b in response to the modification of the pixel circuit.

Figure 7:
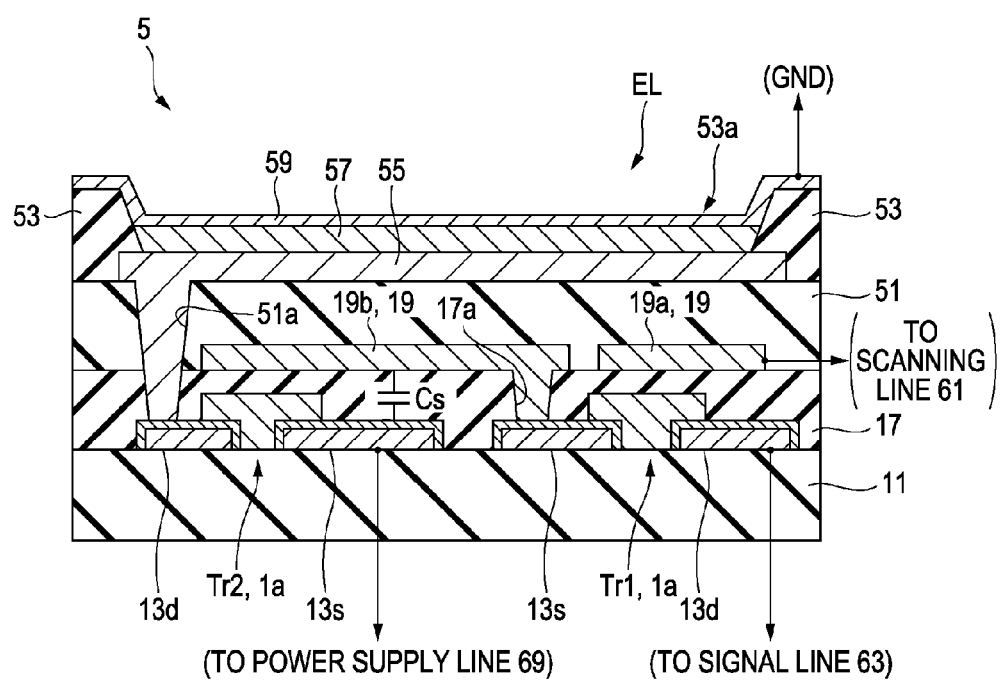
FIG. 7 is a cross sectional view illustrating a portion of the display device according to an embodiment of the invention.

Referring to FIG. 7, as a cross sectional view of one of the pixels included in the display device 5 according to the abovementioned circuit configuration, the portion of the display device is shown, in which the thin film transistors Tr1 and Tr2, retentive capacitor Cs, and the organic electroluminescence element EL are stacked.

As shown in this drawing, as the thin film transistors Tr1 and Tr2 included in each pixel, the top-gate bottom-contact type organic thin film transistors (1a) are provided, for example, which is illustrated in FIG. 1 according to the first embodiment.

The source electrode 13s of the organic thin film transistor Tr1 and a gate electrode 19b of the organic thin film transistor Tr2 are interconnected through a via hole 17a formed in the gate insulating film 17. In addition, the capacitor element Cs is formed with the gate insulating film 17 to be sandwiched between a first portion extending from gate electrode 19b of the organic thin film transistor Tr2 and a second portion extending from source electrode 13s. Still in addition, as also shown in the circuit diagram of FIG. 6, the gate electrode 19a of the organic thin film transistor Tr1 is provided extended to be connected to the scanning line (61), the drain electrode 13d of the organic thin film transistor Tr1 to the signal line (63), and the source electrode 13s of the organic thin film transistor Tr2 to the power supply line (69), respectively.

The signal line 63 and power supply line 69, which are shown in the pixel circuit, may be formed with the same layer structure on the same layer as the source electrode 13s and drain electrode 13d.

The abovementioned thin film transistors, Tr1 and Tr2, and the capacitor element Cs are encapsulated with the interlayer insulating film 51 through a protective film. It is preferable this interlayer insulating film 51 be provided as a planarizing film. A via hole 51a is provided through the interlayer insulating film 51 and gate insulating film 17, extending to the drain electrode 13d of the organic thin film transistor Tr2.

In each of the pixels on the interlayer insulating film 51, the organic electroluminescence element EL is provided connected to the thin film transistor Tr2 through the via hole 51a. This organic electroluminescence element EL is subjected to device isolation using an insulating pattern 53 disposed on the interlayer insulating film 51.

The organic electroluminescence element EL is provided including a pixel electrode 55 formed on the interlayer insulating film 51. The pixel electrode 55 is disposed as a conductive pattern for every pixel, and connected to the drain electrode 13d of the organic thin film transistor Tr2 through the via hole 51a formed in the interlayer insulating film 51. This pixel electrode 55 is configured to be used as anode, for example, and to have light reflectivity.

In addition, the periphery of pixel electrode 55 is covered with the insulating pattern 53 for exerting device isolation onto the organic electroluminescence element EL. The insulating pattern 53 is provided with an opening window 53a for exposing the pixel electrode 55 wide open and this opening window 53a serves as the pixel opening for the organic electroluminescence element EL. Such insulating pattern 53 is formed with a photosensitive resin polymer, for example, which is subjected to patterning process using the lithography method.

An organic layer 57 is disposed, covering the portion over the pixel electrode 55 exposed from the insulating pattern 53. The organic layer 57 has a layered structure provided at least with an organic luminescence layer, and is formed by stacking, in sequence from the side of the anode (pixel electrode 55 in this example), a hole injection layer, hole transport layer, organic luminescent layer, electron transport layer, electron injection layer, and additionally other layers, where necessary. The organic layer 57 is formed through pattering process so that at least the layer containing the organic luminescent layer for each pixel has a different composition, for example, corresponding to respective wavelengths of the luminescent light generated by each organic electroluminescence element EL. In addition, the pixels of each of the wavelengths may be formed utilizing a common layer. Still in addition, when the organic electroluminescence element EL is formed having the minute resonator structure, the film thickness of the organic layer 57 is configured to suitably be adjusted according to the wavelength taken out from each organic electroluminescence element EL.

A common electrode 59 is provided, covering the above-mentioned organic layer 57 and sandwiching the organic layer 57 between the pixel electrode 55 and the common electrode. This common electrode 59 serves as the electrode disposed on the side for taking out the light generated in the organic luminescence layer of the organic electroluminescence element EL, and configured to be formed of the material with light transparency. In addition, since the pixel electrode 55 is for serving as anode, the common electrode 59 is configured so that at least the side thereof in contact with the organic layer 57 is formed with the material capable of functioning as a cathode. Moreover, in the case where the organic electroluminescence element EL is formed having the minute resonator structure, the common electrode 59 is configured to be semitransparent or semi-reflective. In addition, the common electrode 59 is connected to the ground GND as shown also in the circuit diagram of FIG. 7.

As described above, each pixel portion, in which the organic layer 57 is sandwiched between the pixel electrode 55 and common electrode 59, comes to be the part functioning as the organic electroluminescence element EL.

Moreover, although herein omitted from the illustration, the side of forming the layer of each organic electroluminescence element EL is encapsulated with a sealing resin using light transparent materials, and further is clad with a counter electrode using light transparent materials through the sealing resin; thereby forming the display device 5.

With the thus configured display device 5, it becomes feasible to improve display characteristics since the present pixel circuit is formed with the organic thin film transistors 1a having excellent transistor characteristics explained earlier according to the first embodiment.

Incidentally, the display devices have been described hereinabove utilizing the top-gate bottom-contact type organic thin film transistors 1a which are explained earlier with reference to FIG. 1 according to the first embodiment. However, for forming the abovementioned display devices, the bottom-gate bottom-contact structured organic thin film transistors 1b explained with reference to FIG. 3 according to the second embodiment, and the bottom-gate bottom-contact structured organic thin film transistors 1c explained with reference to FIG. 5 according to the third embodiment may well be adopted, and similar effects can be achieved. Furthermore, as the example of the electronic device utilizing the organic thin film transistor in the abovementioned embodiments, active matrix type display devices provided including the organic electroluminescence element EL have been illustrated. However, the electronic device of the present invention is applicable to the widespread use of electronic devices mounting organic thin film transistors. As for the display devices, for example, the electronic device can be applied to liquid crystal display devices and electrophoresis type displays. In addition, it can also be applied to various electronic devices other than the display devices such as ID tags, sensors, and so forth, and similar effects can be achieved.

The present application contains subject matter related to that disclosed in Japanese Priority Patent Application JP 2008-203881 filed in the Japan Patent Office on Aug. 7, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic thin film transistor, comprising:
    a substrate;
    a gate electrode on the substrate;
    an organic insulating layer on the substrate, the organic insulating layer comprising an organic polymer material;
    source and drain electrodes, each including (a) a first layer comprising at least one of nickel (Ni) and copper (Cu) formed as a single layer by electroless plating directly on only a surface of the organic insulating layer, and (b) a second layer comprising a metal material, the second layer being formed by electroless plating as a separate layer over the first layer such that all top and side surfaces of the first layer are covered by the metal material of the second layer; and
    an organic semiconductor layer comprising an organic semiconductor material in a region between the source electrode and the drain electrode,
    wherein,
        the gate electrode underlies at least the region extending between the source and drain electrodes,
        the second layers have respective ohmic contacts with the organic semiconductor layer that are lower in resistance than those which would be had with the first layer alone,
        a surface of the organic insulating layer contains aminosilane mixed therein at least at portions of the organic polymer material on which the source and drain electrodes are disposed, and
        the organic insulating layer is without damage that would otherwise result from a sputtering or firing process.

2. The organic thin film transistor according to claim 1, wherein the metal material of the second layer comprises at least one of gold (Au), platinum (Pt), and palladium (Pd).

3. The organic thin film transistor according to claim 1 or 2, wherein the organic insulating layer serves as a gate insulating film and the gate electrode is disposed under the gate insulating film.

4. An electric device, comprising an organic thin film transistor, the organic thin film transistor including:
    (i) a substrate;
    (ii) a gate electrode on the substrate;
    (iii) an organic insulating layer on the substrate, the organic insulating layer comprising an organic polymer material;
    (iv) source and drain electrodes, each including (a) a first layer comprising at least one of nickel (Ni) and copper (Cu) formed as a single layer by electroless plating directly on only a surface of the organic insulating layer, and (b) a second layer comprising a metal material, the second layer being formed by electroless plating as a separate layer over the first layer such that all top and side surfaces of the first layer are covered by the metal material of the second layer; and (v) an organic semiconductor layer comprising an organic semiconductor material in a region between the source electrode and the drain electrode, wherein, the gate electrode underlies at least the region extending between the source and drain electrodes, the second layers have respective ohmic contacts with the organic semiconductor layer that are lower in resistance than those which would be had with the first layer alone, a surface of the organic insulating layer contains aminosilane mixed therein at least at portions of the organic polymer material on which the source and drain electrodes are disposed, and the organic insulating layer is without damage that would otherwise result from a sputtering or firing process.

5. The electric device according to claim 4, further comprising:

an interlayer insulating film covering the organic thin film transistor; and a conductive pattern connected to one of the source electrode and the drain electrode through a via hole formed in the interlayer insulating film.

6. The electric device according to claim 5, wherein the conductive pattern is a pixel electrode.

7. The electric device according to claim 4, wherein the metal material of the second layer comprises at least one of gold (Au), platinum (Pt), and palladium (Pd).

* * * * *